(12) United States Patent
Lo (10) Patent No.: US 7,990,698 B2
(45) Date of Patent: Aug. 2, 2011

(54) PORTABLE EXTENSION MEMORY STORAGE DEVICE

(75) Inventor: Yu-Nan Lo, Taichung County (TW)

(73) Assignee: Kingston Digital Far East, Inc., Hsinchu (TW)

( * ) Notice: Subject to any disclaimer, the term of this patent is extended or adjusted under 35 U.S.C. 154(b) by 150 days.

(21) Appl. No.: 12/484,235

(22) Filed: Jun. 14, 2009

(65) Prior Publication Data

US 2010/0315762 A1   Dec. 16, 2010

(51) Int. Cl.
*G06F 1/16* (2006.01)
*H05K 5/00* (2006.01)
*H05K 7/00* (2006.01)

(52) U.S. Cl. .................................................. 361/679.4

(58) Field of Classification Search ............. 361/679.02, 361/679.4–679.44, 679.58; 439/344, 345, 439/350, 353
See application file for complete search history.

(56) References Cited

U.S. PATENT DOCUMENTS

| | | | |
|---|---|---|---|
| D494,969 S * | 8/2004 | Lin | D14/480.7 |
| 7,004,780 B1 * | 2/2006 | Wang | 439/353 |
| 7,095,617 B1 * | 8/2006 | Ni | 361/736 |
| 7,153,148 B2 * | 12/2006 | Chen et al. | 439/141 |
| 7,422,454 B1 * | 9/2008 | Tang et al. | 439/131 |
| 7,515,431 B1 * | 4/2009 | Zadesky et al. | 361/752 |
| 7,535,719 B2 * | 5/2009 | Hiew et al. | 361/737 |
| D620,017 S * | 7/2010 | Lo | D14/480.7 |
| 2004/0145875 A1 * | 7/2004 | Yu et al. | 361/752 |
| 2004/0233645 A1 * | 11/2004 | Chen | 361/737 |
| 2008/0218957 A1 * | 9/2008 | Kim | 361/684 |
| 2008/0280490 A1 * | 11/2008 | Nguyen et al. | 439/607 |

* cited by examiner

*Primary Examiner* — Jinhee Lee
*Assistant Examiner* — Adrian S Wilson (57) ABSTRACT

A portable extension memory storage device comprises a body and a slide positioning member. The body includes an elastic positioning tongue. The slide positioning member includes a positioning rib to be engaged into a positioning concave in the positioning tongue. With the elastic positioning tongue, the abrasion can be reduced, and the service life can be extended. The positioning concave offers an assured and firm engagement to improve the convenience in use. The assembly of the portable extension memory storage device can be finished without using any other threaded elements or locking elements, thus reducing the material and labor cost.

8 Claims, 11 Drawing Sheets

PORTABLE EXTENSION MEMORY STORAGE DEVICE

BACKGROUND OF THE INVENTION

1. Field of the Invention

The present invention relates to a portable extension memory storage device, and more particularly to a portable extension memory storage device that can be engaged assuredly and firmly, and can improve convenience in use.

2. Description of the Prior Art

Figure 1:
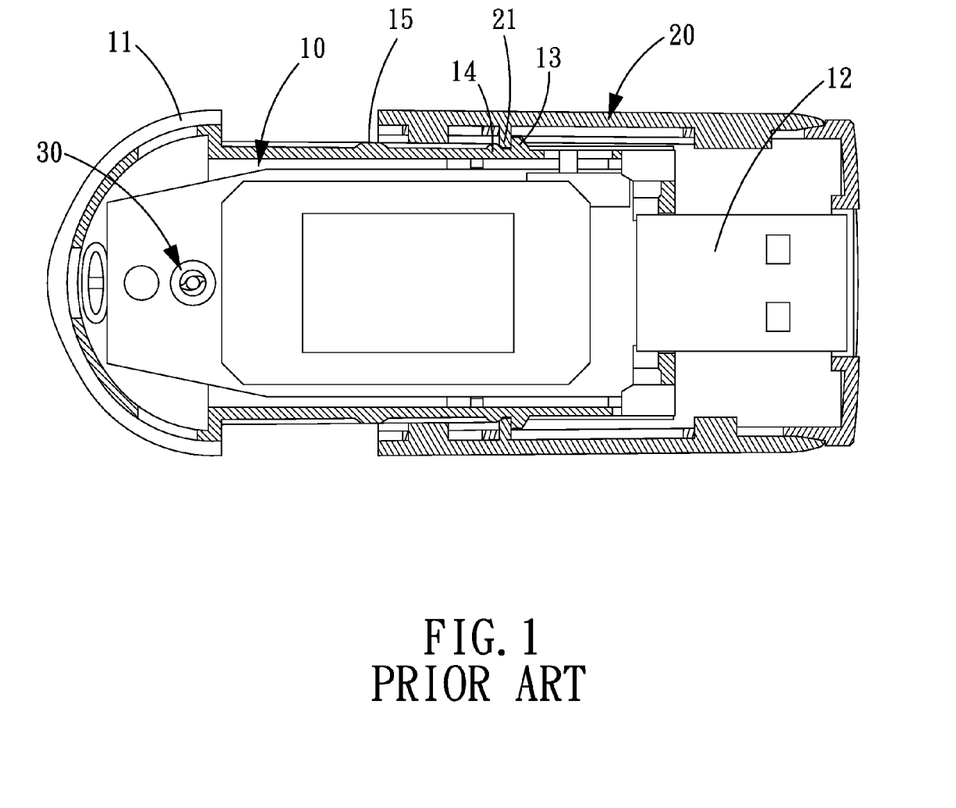
FIG. 1 is a cross sectional view of a conventional combined structure for a portable memory device.
Figure 2:
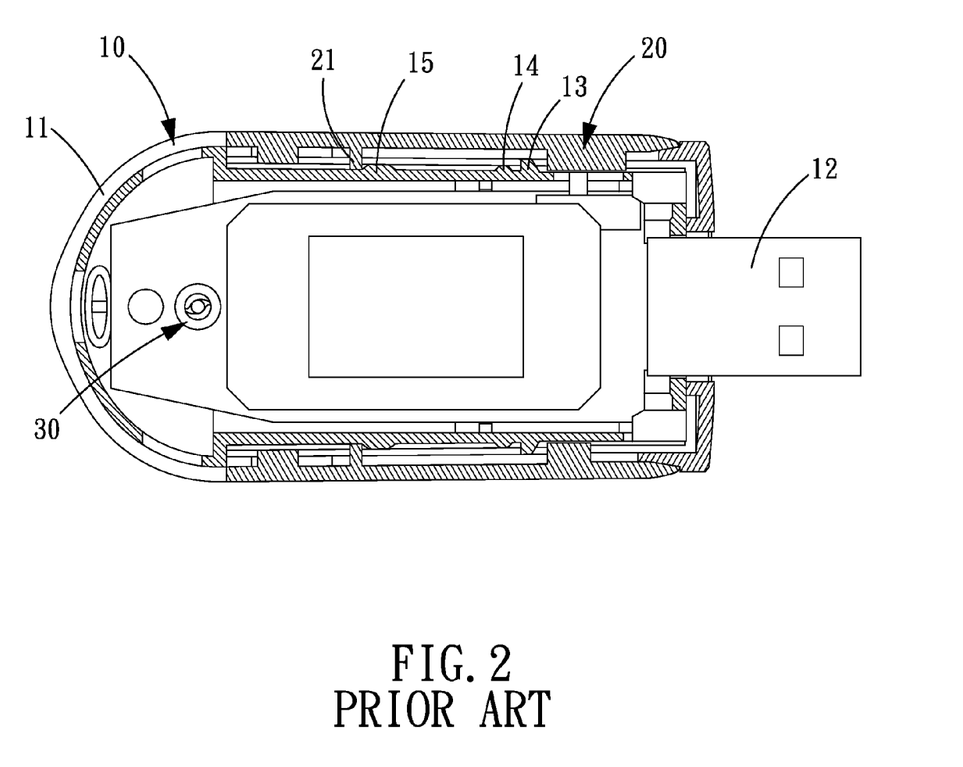
FIG. 2 is an illustrative view showing a use condition of FIG. 1.
Figure 3:
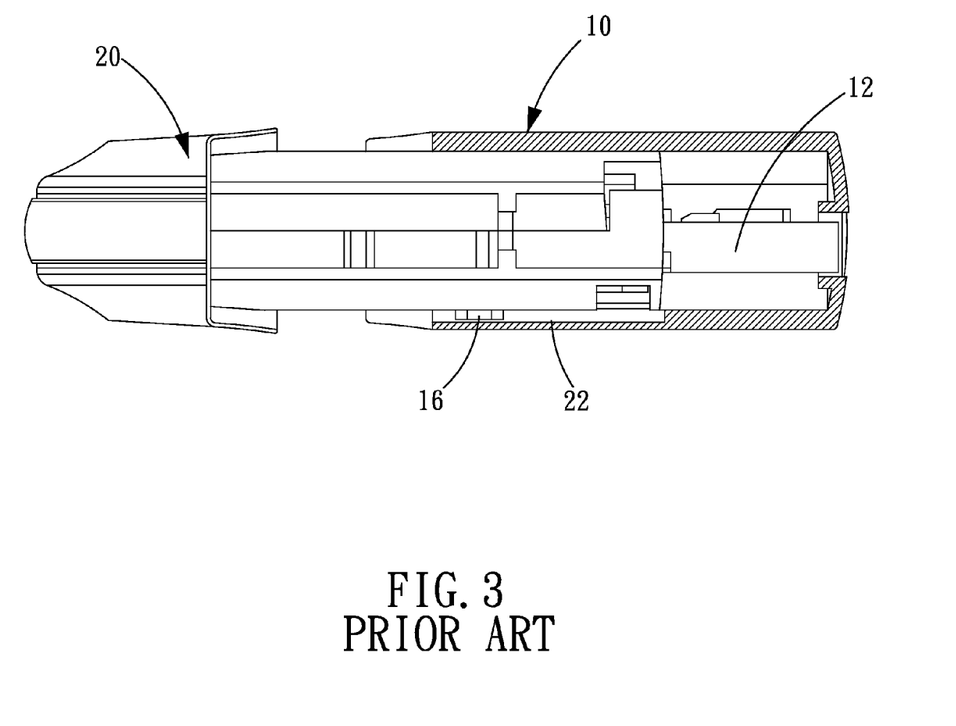
FIG. 3 is another cross sectional view of the conventional combined structure for a portable memory device.
Figure 4:
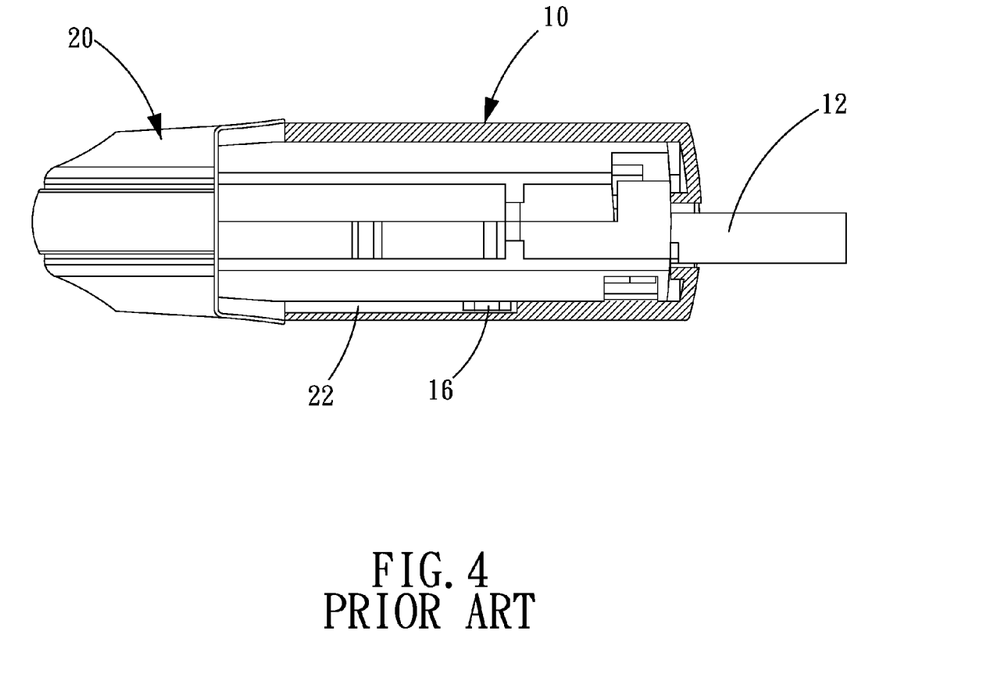
FIG. 4 is an illustrative view showing a use condition of FIG. 3.

Referring to FIGS. 1-4, a combined structure for a portable memory device disclosed in Taiwan Patent No. 549496 comprises a memory body 10 and a shell 20. The memory body 10 consists of two mated half-shells that are fixed together by a threaded element 30. The memory body 10 has a head portion 11 at one end thereof and an adaptor 12 at the other end thereof. The memory body 10 is further provided with two opposite protruding blocks 13 at two opposite sides thereof. The shell 20 is slidably engaged on the memory body 10. The shell 20 is interiorly provided with two stopping plates 21 protruding toward the memory body 10. The shell 20 slides relative to the memory body 10 and is limited by the two protruding blocks 13 at two sides of the memory body 10. The memory body 10 is further provided with two opposite semicircular guide blocks 14 and two opposite trapezoidal guide blocks 15 on a sliding path of the stopping plates 21 relative to the protruding blocks 13. The semicircular guide blocks 14 are located adjacent to the protruding blocks 13, and the trapezoidal guide blocks 15 are located adjacent to the head portion 11. The stopping plates 21 of the shell 20 are guided by the semicircular guide blocks 14 and then limited between the semicircular guide blocks 14 and the protruding blocks 13, as shown in FIG. 1, at this moment, the shell 20 encloses the adaptor 12, forming a state of storage. When the shell 20 slides toward the head portion 11, the stopping plates 21 will be guided by the trapezoidal guide blocks 15 and then limited between the trapezoidal guide blocks 15 and the head portion 11, as shown in FIG. 2, at this moment, the shell 20 is abutted against the head portion 11 to expose the adaptor 12 for use. In addition, the memory body 10 is provided with a guide protrusion 16, and the shell 20 is interiorly provided with a slide 22 corresponding to the guide protrusion 16. As shown in FIGS. 3 and 4, the guide protrusion 16 slides along the slide 22 to make the memory body 10 slide relative to the shell 20.

However, the shell 20 is positioned at two different positions by utilizing the semicircular guide blocks 14 and the trapezoidal guide blocks 15 to guide the two stopping plates 21. The stopping plates 21, the semicircular guide blocks 14 and the trapezoidal guide blocks 15 are all made of hard material, so that the stopping plates 21 can pass across the guide blocks 14, 15 only by a slight deformation of the shell 20. Therefore, it can be found that abrasion inevitably occurs when the stopping plates 21 of the shell 20 pass across the respective guide blocks 14, 15, and after a long time of use, the stopping plates 21 can not be substantially positioned by the respective guide blocks 14, 15, so that the shell 20 can be easily disengaged from the memory body 10. Therefore, when the adaptor 12 of the memory body 10 is inserted into or removed from a computer, the user must hold the shell 20 to apply fore, but since the shell 20 cannot be positioned substantially relative to the memory body 10, the user cannot successfully insert or remove the memory body 10, thus causing much inconvenience.

In addition, due to abrasion of the memory body 10 and the shell 20, the service life of the memory device is greatly reduced.

Furthermore, besides oppositely mating the two half-shells, the assembling process for the memory body 10 further includes using the threaded element 30 to lock the memory body 10. Therefore, the assembling process for the memory body 10 is more complicated, and the number of the assembling parts is increased, thus relatively increasing the production cost.

The present invention has arisen to mitigate and/or obviate the afore-described disadvantages.

SUMMARY OF THE INVENTION

The primary objective of the present invention is to provide a portable extension memory storage device that not only can be engaged assuredly and firmly, has a long life and can improve convenience in use, but also can reduce the assembling procedures, the production cost and improve product competitiveness.

To achieve the objective of the present invention, the portable extension memory storage device comprises a body and a slide positioning member. The body is provided for holding a memory device. The memory device includes a connecting terminal. The body is defined with an opening at one end thereof for extension of the connecting terminal of the memory device. The body includes two side surfaces and a top surface, the two side surfaces of the body each is defined with a slide groove, and the top surface of the body includes two elastic positioning tongues. The respective positioning tongues are elastically deformed in a direction vertical to the top surface of the body and are defined with a positioning concave. The slide positioning member is engaged on the body and is provided with an opening at one end thereof for extension of the connecting terminal of the memory device. The slide positioning member includes two side surfaces and a top surface, and the two side surfaces of the slide positioning member each is provided at an inner side thereof with a slide protruding block. The slide protruding blocks are slidably disposed in the respective slide grooves of the body. The top surface of the slide positioning member is provided with an inner positioning rib to be engaged into the positioning concaves of the positioning tongues of the top surface of the body. Thereby, since the positioning rib of the slide positioning member is engaged into the respective positioning concaves of the positioning tongues of the body, the abrasion can be reduced, thus further extending the service life of present invention. In addition, the slide positioning member can be engaged into the respective positioning concaves assuredly and firmly, so that the convenience in use can be improved. Moreover, the body and the slide positioning member can be assembled with each other easily, so that the production cost of the present invention is correspondingly reduced, improving product competitiveness.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

FIGS. 5-11 illustrate a portable extension memory storage device in accordance with a preferred embodiment of the present invention. The storage device comprises a body and a slide positioning member. The body is provided for holding a memory device A. The memory device A includes a connecting terminal.

Figure 5:
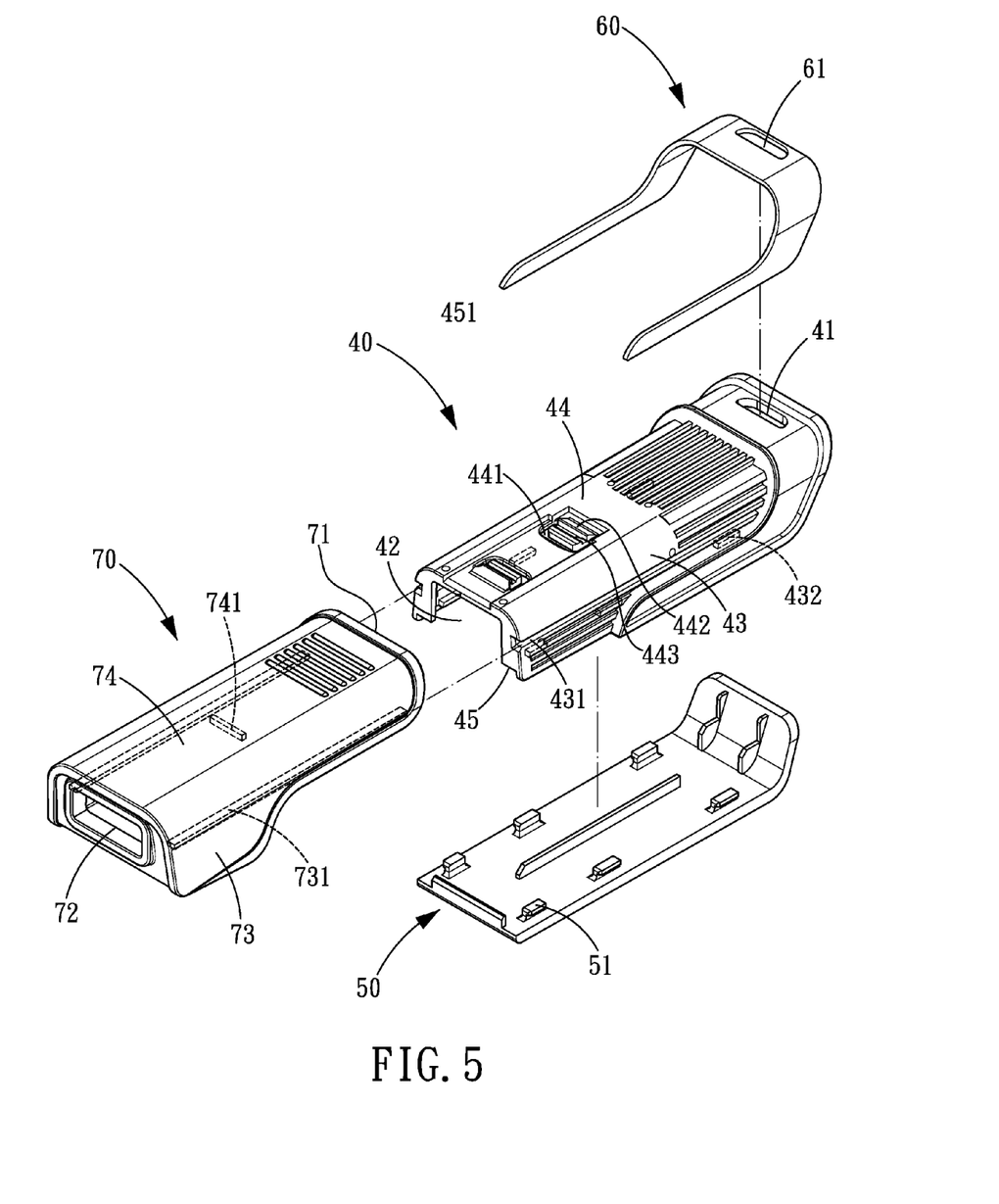
FIG. 5 is an exploded view of a portable extension memory storage device in accordance with the present invention.

The body includes an upper cover 40, a lower cover 50 and a decoration cover 60.

The upper cover 40 is centrally concave and defined with a through hole 41 in one end thereof for insertion of a hanging ornament, rope or a key ring. The upper cover 40 is defined with an opening 42 at the other end thereof for extension of the memory device A. The upper cover 40 includes two side surfaces 43, a top surface 44 and an opened bottom flange 45. The two side surfaces 43 each are defined with a slide groove 431 in communication with the opening 42. The top surface 44 is defined with two spaced notches 441 adjacent to the opening 42 to form two elastic positioning tongues 442 within the two notches 441. The respective positioning tongues 442 are elastically deformed in a direction vertical to the top surface 44 of the upper cover 40. The two positioning tongues 442 each are defined with a positioning concave 443. Each of the two side surfaces 43 of the upper cover 40 is provided with three spaced positioning protrusions 432 at an inner side thereof.

The lower cover 50 is sheet-shaped and configured correspondingly to the bottom flange 45 of the upper cover 40 in such a manner that the lower cover 50 can be covered on the bottom flange 45 of the upper cover 40. The lower cover 50 is provided with three positioning hooks 51 for correspondingly hooking on the positioning protrusions 432 of the upper cover 40. The memory device A is disposed between the upper cover 40 and the lower cover 50. The connecting terminal of the memory device A extends from the opening 42 of the upper cover 40.

The decoration cover 60 is defined with a through hole 61 in an upper side thereof and engaged on the end of the upper cover 40 which is defined with the through hole 41. The through hole 61 of the decoration cover 60 is in alignment with the through hole 41 of the upper cover 40.

The slide positioning member 70 is provided with an open end 71 at one end thereof and an opening 72 at the other end thereof for extension of the connecting terminal of the memory device A. The slide positioning member 70 includes two side surfaces 73 and a top surface 74. The two side surfaces 73 of the slide positioning member 70 each are provided at an inner side thereof with a slide protruding block 731 corresponding to the respective slide grooves 431 of the upper cover 40. The open end 71 of the slide positioning member 70 is engaged on the body. The slide protruding blocks 731 are disposed in the respective slide grooves 431. The opening 72 of the slide positioning member 70 is in alignment with the opening 42 of the upper cover 40. The top surface 74 of the slide positioning member 70 is provided with an inner positioning rib 741 to be engaged into the positioning concaves 443 of the positioning tongues 442 of the upper cover 40.

Figure 6:
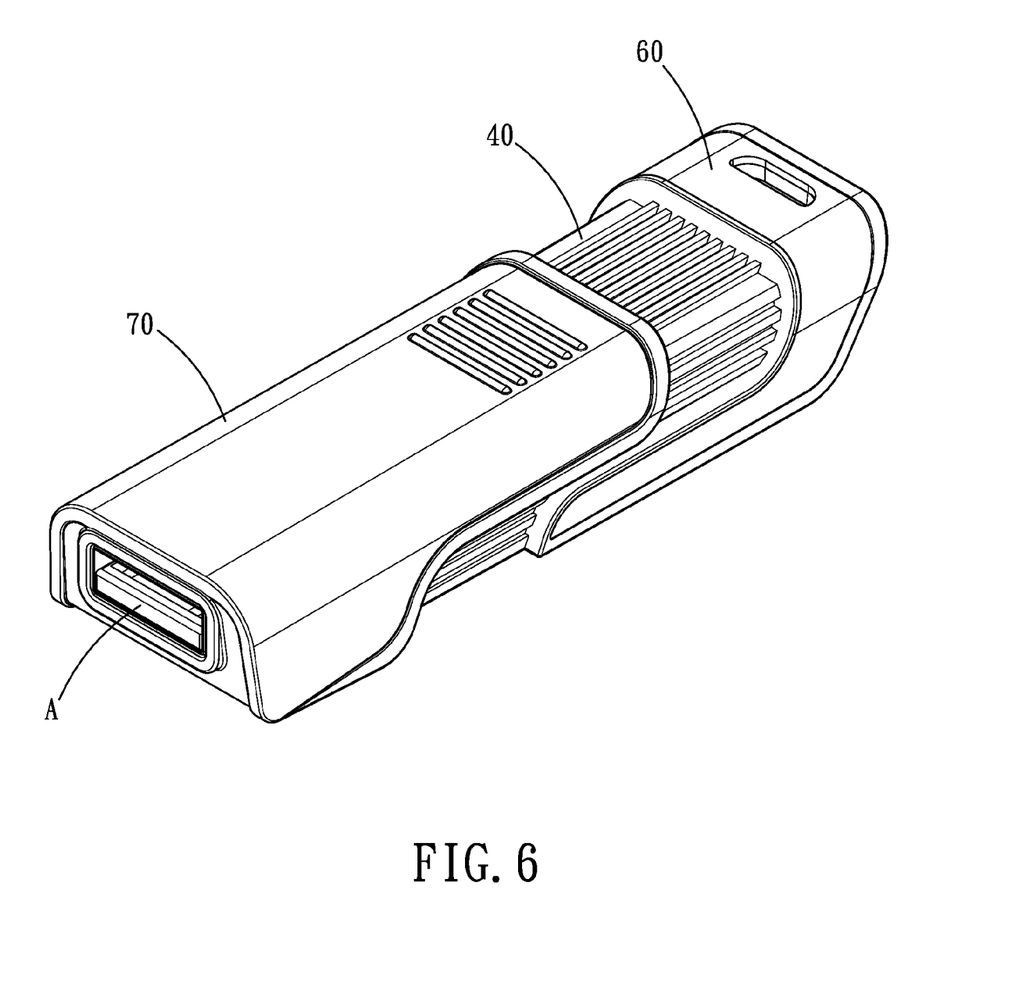
FIG. 6 is an assembly perspective view of the portable extension memory storage device in accordance with the present invention.
Figure 7:
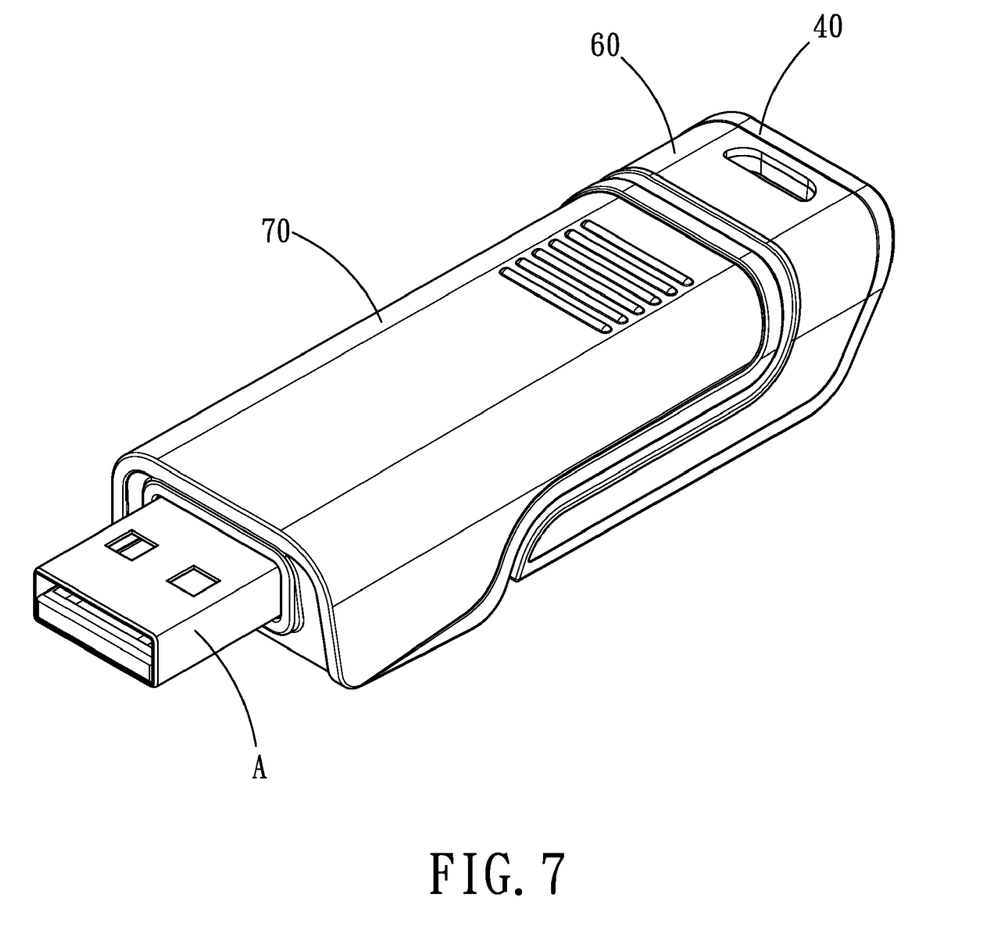
FIG. 7 is an illustrative view showing the portable extension memory storage device in accordance with the present invention.
Figure 8:
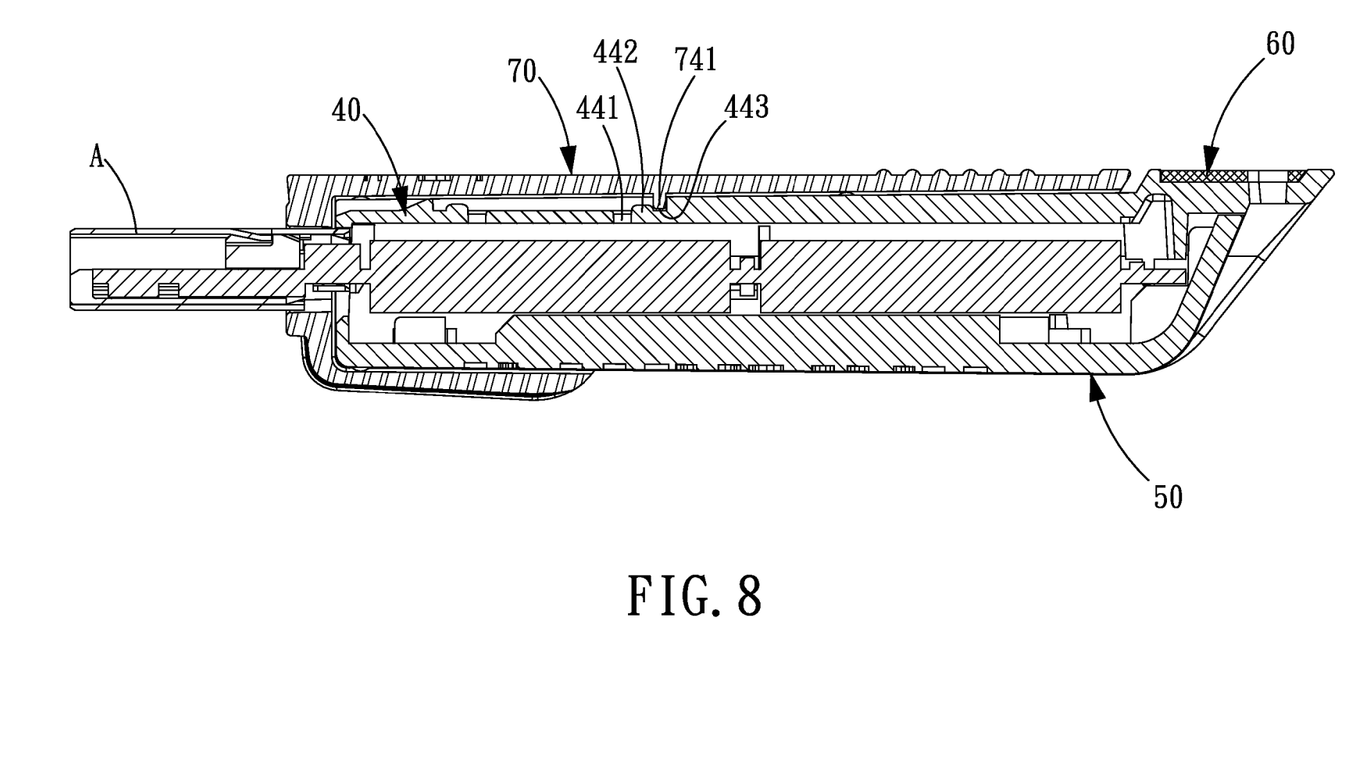
FIG. 8 is a cross sectional view of the portable extension memory storage device in accordance with the present invention.
Figure 9:
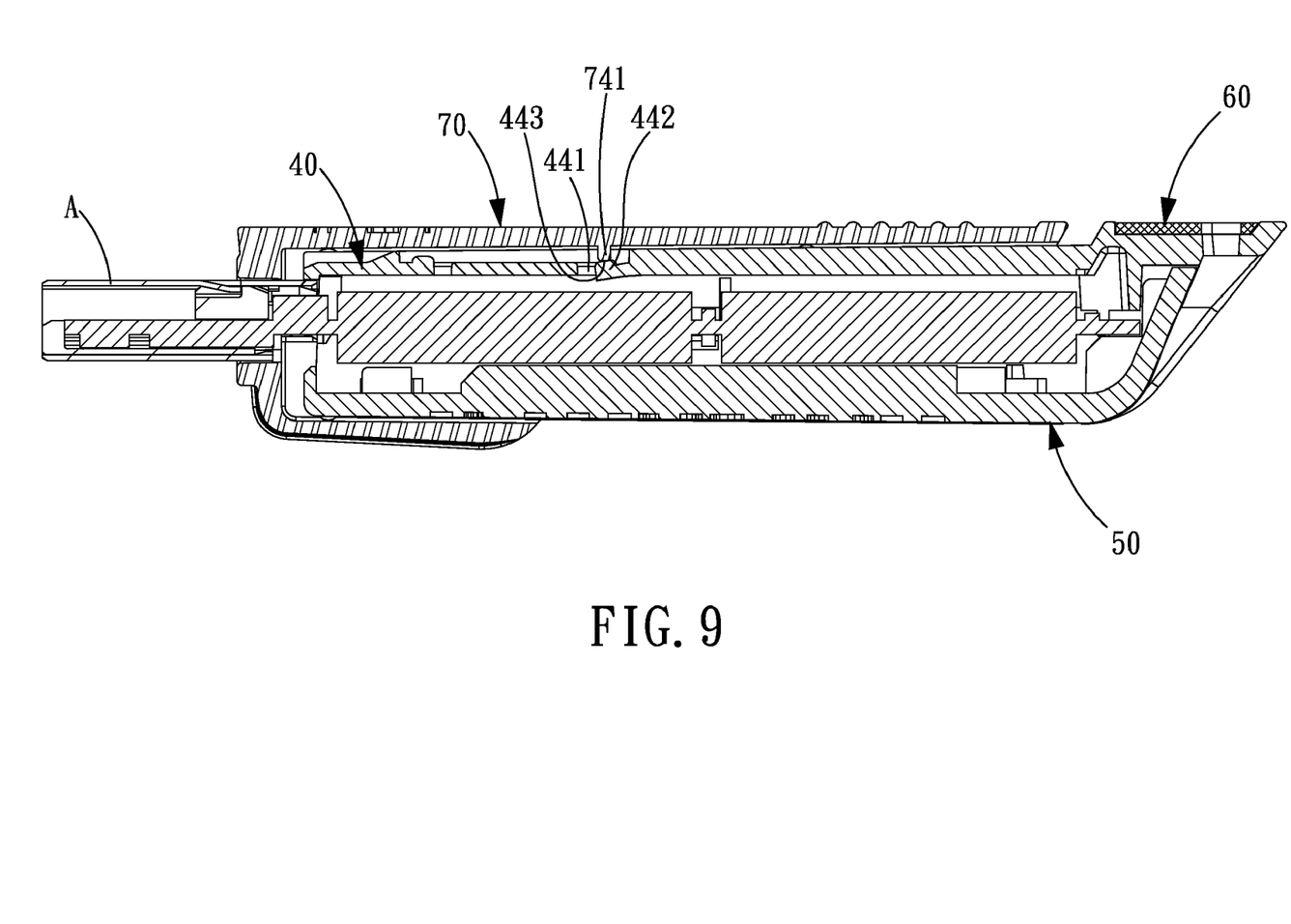
FIG. 9 is a cross sectional view of the portable extension memory storage device in accordance with the present invention.
Figure 10:
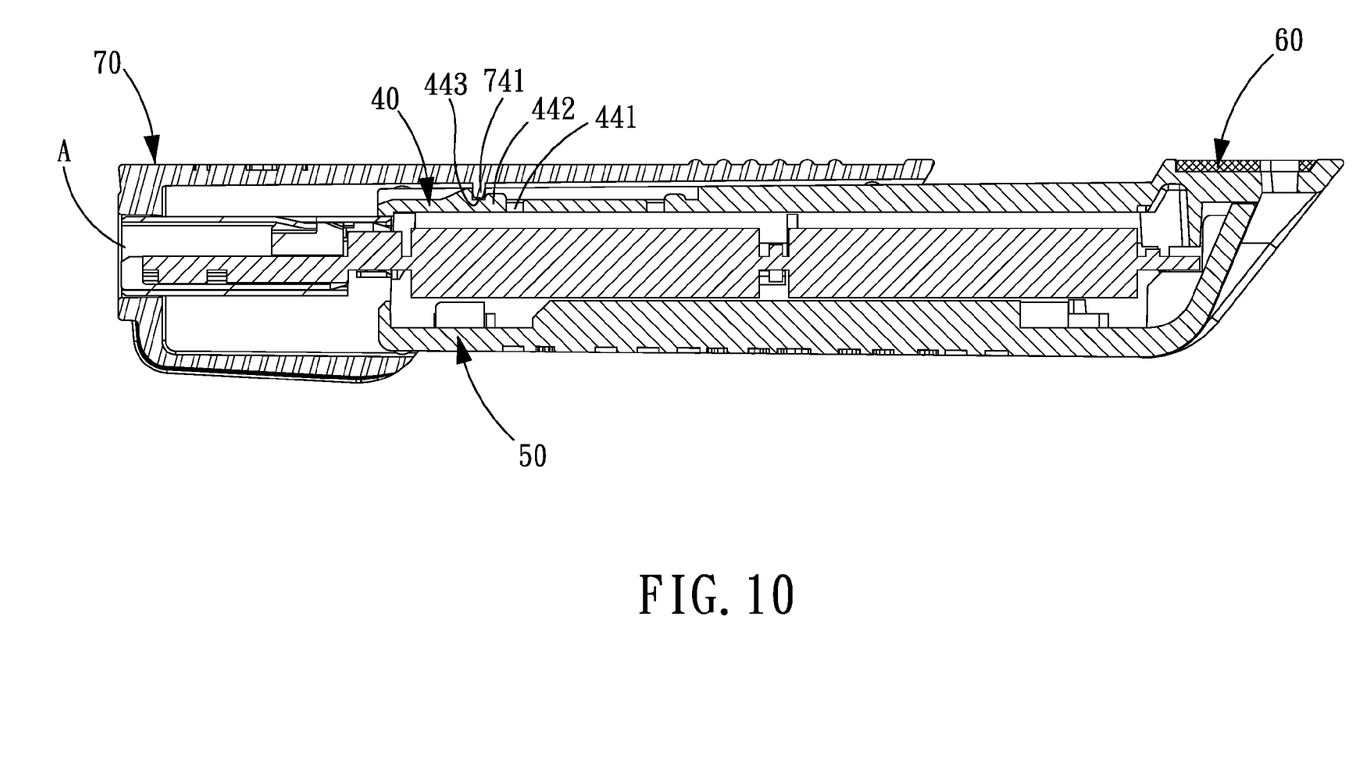
FIG. 10 is a cross sectional view of the portable extension memory storage device in accordance with the present invention.
Figure 11:
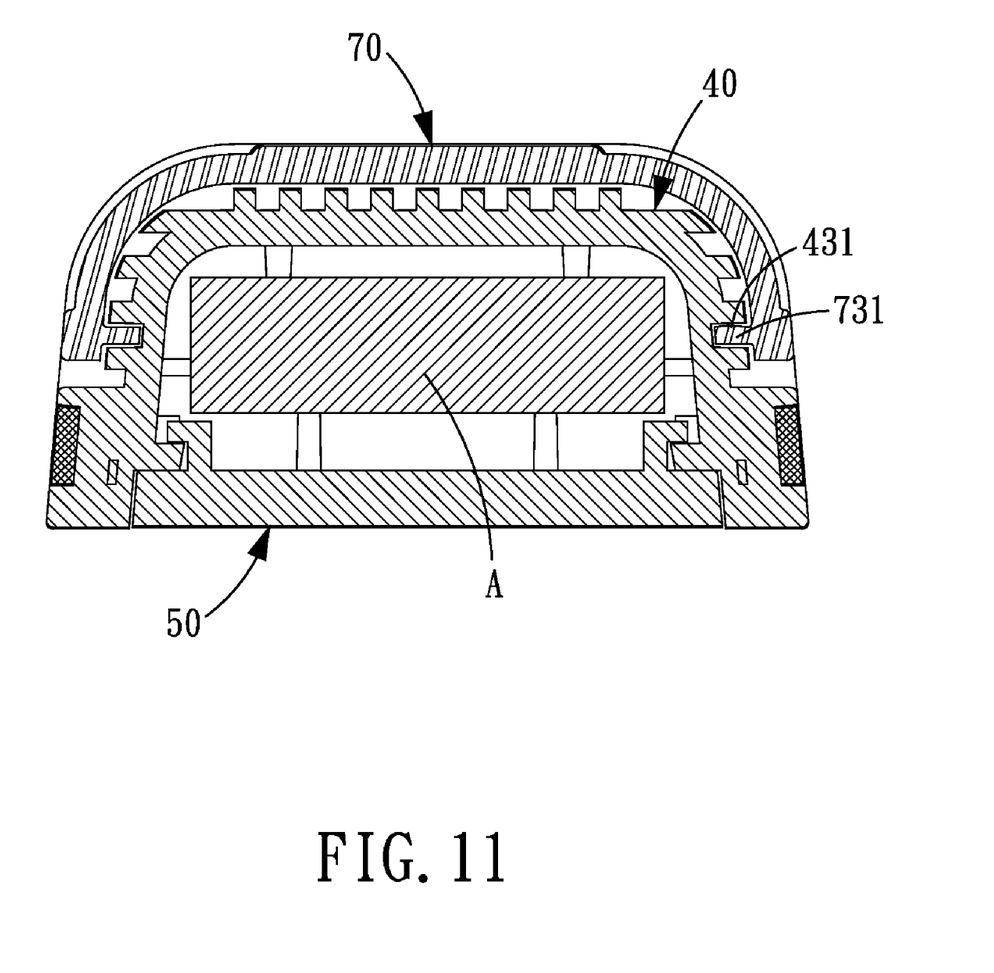
FIG. 11 is an assembly cross sectional view of the portable extension memory storage device in accordance with the present invention.

When in assembly, the lower cover 50 will be covered on the bottom flange 45 of the upper cover 40 in such a manner that the positioning hooks 51 of the lower cover 50 hook on the respective positioning protrusions 432 of the upper cover 40, and then the decoration cover 60 will be engaged on the end of the upper cover 40 which is defined with the through hole 41 in such a manner that the through hole 61 of the decoration cover 60 is in alignment with the through hole 41 of the upper cover 40, after that, the open end 71 of the slide positioning member 70 will be engaged on the body in such a manner that the slide protruding blocks 731 of the slide positioning member 70 are slidably disposed in the slide grooves 431 of the upper cover 40, and the positioning rib 741 of the top surface 74 of the slide positioning member 70 are engaged into the positioning concaves 443 of the upper cover 40. As shown in FIGS. 6 and 7, when the slide positioning member 70 slides to the end of the upper cover 40 which is defined with the through hole 41, the connecting terminal of the memory device A will extend out of the opening 72 of the slide positioning member 70 and the opening 42 of the upper cover 40 for use. When the slide positioning member 70 slides away from the body, the slide positioning member 70 will enclose the connecting terminal of the memory device A, so that the connecting terminal of the memory device A is stored in the slide positioning member 70.

Referring to FIGS. 8-11 again, when the slide positioning member 70 is pushed to make the slide protruding blocks 731 of the slide positioning member 70 slide along the slide grooves 431 of the upper cover 40 until the positioning rib 741 slides to and is pressed against one of the positioning tongues 442, this positioning tongue 442 will be pushed to bend downwards by the positioning rib 741 since it has elasticity because of the notch 441. After the positioning tongue 442 bends downwards, the positioning rib 741 of the slide positioning member 70 can then be allowed to engage into the corresponding positioning concave 443. Therefore, by engaging the slide positioning member 70 alternatively into the two positioning concaves 443, the memory device A can be switched between use or storage positions.

Based on the above description, the portable extension memory storage device of the present invention can offer the following functions assuredly:

1. Due to the deformation of the elastic positioning tongues 442, the positioning rib 741 can be guided to engage into the respective positioning concaves 443, with such arrangements, because of the elastic buffer capacity of the elastic positioning tongues 442, the abrasion can be reduced between the slide positioning member 70 and the upper cover 40, thus further extending the service life of present invention.

2. The slide positioning member 70 is secured onto the upper cover 40 by engaging the positioning rib 741 into the respective positioning concaves 443, the positioning rib 741 of the slide positioning member 70 can be allowed to engage into the corresponding positioning concave 443 assuredly and firmly because of the elastic positioning tongues 442, and the assured engagement can also improve convenience in use.

3. The upper cover 40 and the lower cover 50 are assembled by hooking the positioning hooks 51 on the positioning protrusions 432, and the slide positioning member 70 is engaged into the respective positioning concaves 443 through the positioning rib 741, so that the assembly of the portable extension memory storage device of the present invention can be finished without using any other threaded elements or locking elements, thus not only saving the cost in purchasing the threaded elements or locking element, but also relatively reducing the assembling procedures, therefore, the production cost of the present invention is correspondingly reduced, improving product competitiveness.

While we have shown and described various embodiments in accordance with the present invention, it is clear to those skilled in the art that further embodiments may be made without departing from the scope of the present invention.

What is claimed is:

1. A portable extension memory storage device comprising a body and a slide positioning member, the body being provided for holding a memory device, the memory device includes a connecting terminal, wherein:

the body being provided with an opening for extension of the connecting terminal of the memory device, the body including two side surfaces and a top surface, the two side surfaces of the body each being defined with a slide groove, the top surface of the body including two elastic positioning tongues, the respective positioning tongues being elastically deformed in a direction vertical to the top surface of the body, and the two positioning tongues each being defined with a positioning concave, the top surface of the body being defined with two spaced notches adjacent to the opening to form two elastic positioning tongues within the two notches; and the slide positioning member being engaged on the body, the slide positioning member being provided with an opening at one end thereof for extension of the connecting terminal of the memory device, the slide positioning member including two side surfaces and a top surface, the two side surfaces of the slide positioning member each being provided at an inner side thereof with a slide protruding block, the slide protruding blocks being slidably disposed in the respective slide grooves of the body, the top surface of the slide positioning member being provided with an inner positioning rib to be engaged into the positioning concaves of the tongues of the top surface of the body.

2. The portable extension memory storage device as claimed in claim 1, wherein the body includes an upper cover and a lower cover, the upper cover includes the two side surfaces, the top surface and a bottom flange, the two side surfaces of the upper cover each are provided with plural spaced positioning protrusions at an inner side thereof, the lower cover is configured correspondingly to the upper cover, the lower cover is covered on the bottom flange of the upper cover, the lower cover is provided with plural positioning hooks for correspondingly hooking on the positioning protrusions of the upper cover.

3. The portable extension memory storage device as claimed in claim 2, wherein the upper cover is defined with a through hole in one end thereof, the opening of the body is defined in the other end of the upper cover, the body further includes a decoration cover, the decoration cover includes a through hole and is engaged on the end of the upper cover which is defined with the through hole, the through hole of the upper cover is in alignment with the through hole of the decoration cover.

4. The portable extension memory storage device as claimed in claim 2, wherein the upper cover is centrally concave.

5. The portable extension memory storage device as claimed in claim 2, wherein the lower cover is sheet-shaped.

6. The portable extension memory storage device as claimed in claim 1, wherein the notches of the body are defined adjacent to the opening of the top surface of the upper cover.

7. The portable extension memory storage device as claimed in claim 1, wherein the respective slide grooves are in communication with the opening of the body.

8. The portable extension memory storage device as claimed in claim 1, wherein the slide positioning member is provided with an open end at the other end thereof, the open end of the slide positioning member is engaged on the body.

\* \* \* \* \*